US008909164B2

United States Patent
Castex

(10) Patent No.: US 8,909,164 B2
(45) Date of Patent: Dec. 9, 2014

(54) FREQUENCY OFFSET CORRECTION

(75) Inventor: Franck Castex, Le Mans (FR)

(73) Assignee: ST-Ericsson, SA, Plan-les-Ouates (CH)

( * ) Notice: Subject to any disclaimer, the term of this patent is extended or adjusted under 35 U.S.C. 154(b) by 186 days.

(21) Appl. No.: 13/375,728

(22) PCT Filed: Jun. 3, 2010

(86) PCT No.: PCT/EP2010/057796
§ 371 (c)(1),
(2), (4) Date: Dec. 1, 2011

(87) PCT Pub. No.: WO2010/139769
PCT Pub. Date: Dec. 9, 2010

(65) Prior Publication Data
US 2012/0071110 A1    Mar. 22, 2012

(30) Foreign Application Priority Data

Jun. 3, 2009 (FR) ...................................... 09 53673

(51) Int. Cl.
H04B 1/40 (2006.01)
H04B 1/06 (2006.01)
H04B 7/00 (2006.01)
H03L 7/06 (2006.01)
H04W 56/00 (2009.01)

(52) U.S. Cl.
CPC *H03L 7/06* (2013.01); *H04W 56/00* (2013.01)
USPC ............................................. 455/76; 455/255

(58) Field of Classification Search
USPC ........................................... 702/106; 455/76
See application file for complete search history.

(56) References Cited

U.S. PATENT DOCUMENTS

| 4,847,569 | A | * | 7/1989 | Dudziak et al. | 331/25 |
| 4,980,652 | A | * | 12/1990 | Tarusawa et al. | 331/1 A |
| 5,216,389 | A | | 6/1993 | Carralero | |
| 6,628,926 | B1 | * | 9/2003 | van de Beek et al. | 455/75 |
| 7,130,368 | B1 | * | 10/2006 | Aweya et al. | 375/376 |
| 2003/0076175 | A1 | * | 4/2003 | Fischer et al. | 331/17 |
| 2005/0277397 | A1 | * | 12/2005 | Christoffers et al. | 455/255 |
| 2006/0055466 | A1 | * | 3/2006 | Hirano et al. | 331/16 |

FOREIGN PATENT DOCUMENTS

| EP | 735693 A1 * | 10/1996 | H03L 7/189 |
| EP | 1233520 A2 | 8/2002 | |
| GB | 2242796 A * | 10/1991 | H03L 7/08 |

* cited by examiner

*Primary Examiner* — Wesley Kim
*Assistant Examiner* — Devan Sandiford
(74) *Attorney, Agent, or Firm* — Coats and Bennett, PLLC

(57) ABSTRACT

The invention relates to a radio-frequency circuit comprising: —a control unit; and —a phase-locked loop; wherein the control unit is arranged to determine an offset between an actual value of a reference frequency at the input to the loop on the basis of a measurement of the signal output from the filter of the loop, and a theoretical value of said frequency known to the control unit, via a relation known to the control unit, and to control a correction of said offset.

10 Claims, 2 Drawing Sheets

FREQUENCY OFFSET CORRECTION

TECHNICAL FIELD

This invention relates in general to the field of integrated circuits used in the field of radio communications.

More particularly, it relates to estimating the frequency offset which may appear in the circuits of a radio communication terminal, between an actual reference clock frequency and the theoretical reference clock frequency.

The invention has applications in particular in the integrated circuits equipping mobile radiotelephony devices.

TECHNOLOGICAL BACKGROUND

Imprecision in the ratio between the true value of the frequency of a clock of a radio communication terminal and the carrier frequency of the signals it receives is problematic. The terminal must synchronize precisely with the frequency of the electromagnetic waves used to carry communication signals on the radio communications network.

An offset can have various causes. For example, temperature variations in the circuits or aging of components (such as the quartz in the oscillators) may cause such an offset.

It is desirable to estimate this offset so it can be corrected to ensure good communication quality.

PRIOR ART

To reduce the frequency offset concerned, terminals of the prior art rely on the network. The network sends control signals specifically provided for this purpose, and correction algorithms are applied in the terminal based on these signals (AFC or "Automatic Frequency Control" algorithms).

The prior art solutions have many disadvantages, however.

Firstly, in order to synchronize, the terminal must already have access to the network to receive the synchronization control signals. Loss of network can occur during the synchronization step, however, which implies that the signals must be received over a long period or that several attempts are necessary.

Significant synchronization time results from this, as well as significant energy consumption. These parameters are essential to communication quality and terminal power management.

Secondly, the synchronization is dependent on the modulation used on the network because it depends on the frame structure organizing the signaling (control) channels in the synchronization signals received.

This means that if there is a change to the network, and to the modulation used, the synchronization algorithms must be redone, and these are becoming increasingly complex. This results in additional development costs for algorithms and equipment.

Lastly, the quality of the reception strongly influences the effectiveness of the synchronization.

Poor radio reception conditions therefore result in a loss of accuracy in the synchronization.

Some prior art terminals contain temperature-compensating circuits. It is known that the characteristics of the crystals used to generate the clock signal are highly sensitive to temperature.

These temperature-compensating circuits measure the temperature, then correct the frequency based on a knowledge of the frequency deviation characteristics of the crystal as a function of the temperature.

Such circuits represent an extra cost in terms of materials and development. In addition, they occupy more space on the silicon of the complete telecommunications circuit, which is contrary to the increasing miniaturization of circuits.

In addition, crystals for which such a deviation characteristic is available and reliable have a very high cost, which affects the cost of the terminal.

SUMMARY OF THE INVENTION

A need exists for a simple and efficient solution for estimating the frequency offset described above in order to correct it.

For this purpose, a radio-frequency circuit is proposed, comprising:
- an output for delivering a radio-frequency output signal;
- a first control unit;
- a memory;
- an input for receiving an input signal at a given reference frequency;
- a phase-locked loop comprising:
  - a controlled frequency generator having an input coupled to the output of a filter whose input is coupled to the output of a comparator that has one input coupled to the input of the circuit and another input coupled to a feedback path issuing from an output of the controlled frequency generator.

The memory stores a relation between signal values at the filter output and reference frequency values. The control unit is arranged to determine an offset between an actual value of the reference frequency obtained on the basis of a measurement of the signal output from the filter, and a theoretical value of the frequency known to the control unit, via the relation stored in the memory, and to control a correction of the offset.

The invention takes advantage of phase-locked loops or PLL placed in the terminals in order to estimate the frequency offset and eliminate frequency offsets. No substantial increase in the costs of material is involved. Similarly, no additional surface area is used in the circuits of the hardware, and no additional power is consumed.

This also has the effect of reducing the synchronization time and increasing its accuracy, because the offset estimate, and therefore its correction, can be done before accessing the network. Another effect is that it reduces the power consumption of the terminal, because the synchronization is faster and because the synchronization is no longer affected by loss of network. It also has the effect of reducing the terminal development cost, because the estimate is not dependent on changes to the network.

The invention advantageously uses information already indirectly available in the terminal but which has never been used for frequency offset estimation for synchronization.

It is possible to make calibrations throughout the life of the terminal. Thus, even if the characteristic curve of the signal at the filter output versus the frequency can evolve due to the aging of components, the easy measurement offered by the invention allows determining this curve throughout the life of the circuit.

In certain embodiments, the circuit additionally comprises a memory for storing a table describing the correspondence relation between the signal values at the filter output and the signal frequency values at the input.

The circuit can additionally comprise a measurement module for measuring the signal values at the filter output, in which the control unit is configured to calibrate the circuit in order to obtain, beforehand and/or in a recurring manner, the correspondence relation between the signal values at the filter output and the signal frequency values at the input.

Also proposed is a mobile communications terminal comprising a circuit as presented above, a control method for such a circuit, and a computer program comprising instructions for implementing said method when it is loaded and executed in a processor.

These objects of the invention have at least the same advantages as those associated with the method for estimating the frequency offset.

BRIEF DESCRIPTION OF DRAWINGS

Other features and advantages of the invention will be apparent from reading the following description. This description is purely illustrative and is to be read in light of the attached drawings, in which.

DETAILED DESCRIPTION OF EMBODIMENTS

Figure 1:
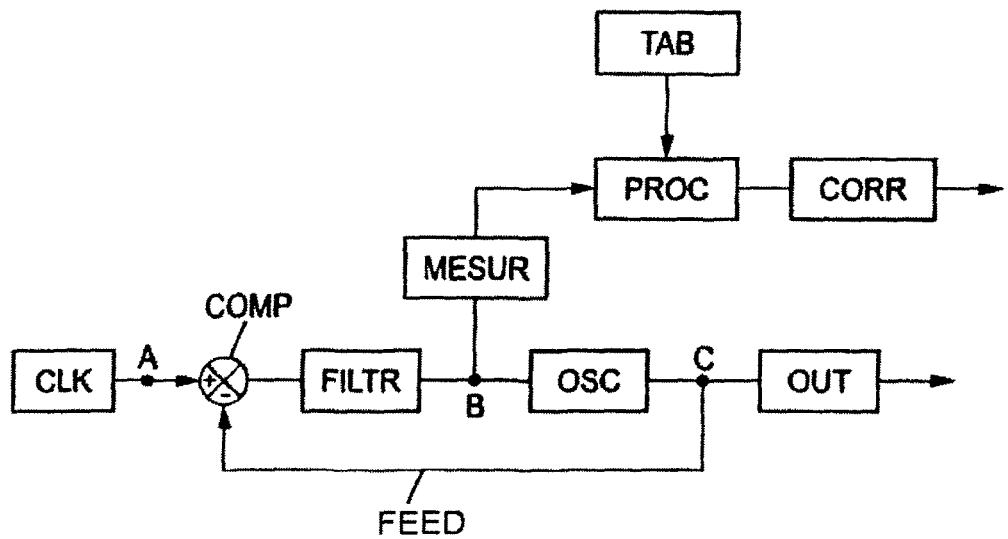
FIG. 1 illustrates a circuit according to some embodiments of the invention.

A circuit according to an embodiment of the invention is represented schematically in FIG. 1. This circuit comprises a comparator COMP which has an input A coupled to the output of a clock CLK of the circuit, and another input is supplied by a feedback path FEED. The output from the comparator is coupled to the input of a lowpass filter FILTR whose output B is coupled to the input of a controlled oscillator OSC, for example a voltage-controlled oscillator. The output from the controlled oscillator C is coupled to the feedback path, and to various devices OUT receiving the radio-frequency signal output from the controlled oscillator. The feedback path can comprise a frequency divider, not represented.

The assembly formed by the comparator, the filter, the oscillator, and the feedback loop, associated with the clock, is called a phase-locked loop. Such a loop is generally used for controlling frequencies in various electronic circuits. Conventionally, the input of the loop is composed of the comparator input which is not coupled to the feedback loop, and the output from the loop is composed of the output from the controlled oscillator.

In the following description, a new manner of using this loop is presented in which the signal at the filter output is used, instead of the output from the loop, in order to estimate the frequency offset and correct it.

The clock is, for example, a quartz clock. Such clocks are used to provide a signal whose frequency serves as a reference frequency for various circuits.

Of course, it is possible to provide another element instead of the clock. The proposed circuit allows measuring frequency offsets in signals issuing from other devices.

Figure 2:
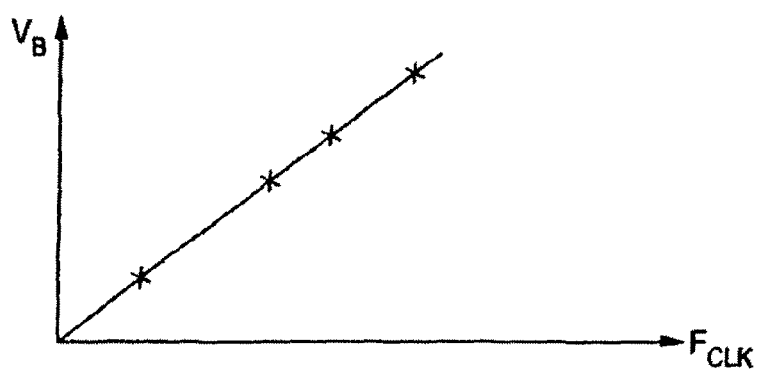
FIG. 2 illustrates a voltage/frequency characteristic curve relating the voltage at the filter output and the clock frequency of the circuit illustrated in FIG. 1.

FIG. 2 illustrates a curve representing the distribution of various signal values at the filter output B, as a function of different frequencies of the signal at the comparator input A. In this example, the curve is linear. One can see that a multiplying factor exists between the signal value at the filter output B and the signal frequency value at the comparator input A. A curve such as the one presented is called a characteristic curve of the circuit.

To obtain the characteristic curve, a series of measurements of the signal are obtained at the filter output for different values of the signal frequency at the comparator input A. For example, the voltage at the filter output B is measured. One may possibly extrapolate other values in order to obtain a continuous characteristic curve. In the example in FIG. 2, a straight line representing a linear relation between the signal values at the filter output B and the signal frequency values at the comparator input A is deduced from four points.

Establishing the characteristic curve can be done during the design phase and/or at various moments in the life of the circuit. In fact, the relation that exists between the signal value at the filter output B and the signal frequency value at the comparator input A can evolve over time.

For example, if one considers that a linear relation exists between the signal value at the filter output B and the signal frequency value at the comparator input A, the value of the coefficient of proportionality can vary over time. Thus, if the signal frequency value at the comparator input A is accessed by applying a multiplying factor, corresponding to the inverse of the coefficient of proportionality, to a measured value for the value at the filter output, and this multiplying factor has evolved between the moment when the characteristic curve was established and the moment when the measurement is made, the value of the frequency obtained will not be accurate.

The characteristic curve can be established during circuit assembly, or during operation.

The following description is in the context of establishing the characteristic curve during operation. In fact, one can consider regularly establishing the characteristic curve during the life of the circuit in order to take into account various factors which may modify it. For example, the characteristic curve is established at regular intervals of time in order to take component aging into account.

During operation, to estimate a frequency offset of a signal at the comparator input A, as represented schematically in FIG. 1, the circuit comprises a measurement module MESUR for measuring the value of the signal at the filter output B.

For example, the measurement module comprises an analog-to-digital converter coupled to a register (neither is represented). The input of said converter is, in this example, coupled to the filter output B and converts the values of the signal at the filter output into digital values. The output from the converter is coupled to a register which stores the values provided by the converter. Thus there is a register containing values for the voltage input to the oscillator.

The measurement module is arranged between the output B of the filter and a processor PROC in charge of comparing the value measured at the filter output B, as stored in the above-mentioned register, with a value from the characteristic curve.

The characteristic curve is stored in a memory TAB in the form of a table of correlations between the signal values measured at the filter output B when establishing the characteristic curve and the frequency values of the signal at the comparator input A during the same establishing of the characteristic curve.

In one variation, the memory TAB stores the characteristic curve in the form of a mathematical model of the characteristic curve. This model can be represented by a set of parameters. In the example of the linear characteristic curve described above, this involves for example storing a multiplying factor and an instruction for multiplying the measured value of the signal at the filter output by this coefficient. This variation is advantageous when the measured value is not found in the table, because the model allows finding any value for the signal frequency at the comparator input from any measurement of the signal value at the filter output.

When the measured value is not found in the table, the processor can for example extrapolate between the two values contained in the table that are closest to the measured value.

In another embodiment, it is possible to force the processor to choose a value in the table closest to the measured value.

The value of the signal frequency at the comparator input A obtained by means of the characteristic curve constitutes an estimate of this frequency. This estimate is transmitted to a correction unit CORR in order to correct the offset in the circuit.

For example, the correction unit compares the estimate of the frequency with a theoretical value of the signal frequency at the clock output. This theoretical value is for example the frequency of the carrier signal of a telecommunications network, when the circuit is used for synchronization on this network.

Then, if the difference is greater than a certain threshold, the correction unit acts directly on the device providing the signal to the comparator input A (the clock for example) in order to increase or decrease the frequency of this signal until the measurements of the signal value at the filter output return signal values at the comparator input A which are identical to the theoretical value.

In another mode, a frequency adder is placed between the device providing the signal to the comparator input A (the clock for example) and the circuits that use the signal that comes out. This frequency adder injects a signal which corrects the difference observed between the value of the signal frequency at the clock output obtained via the characteristic curve and the theoretical value.

Figure 3:
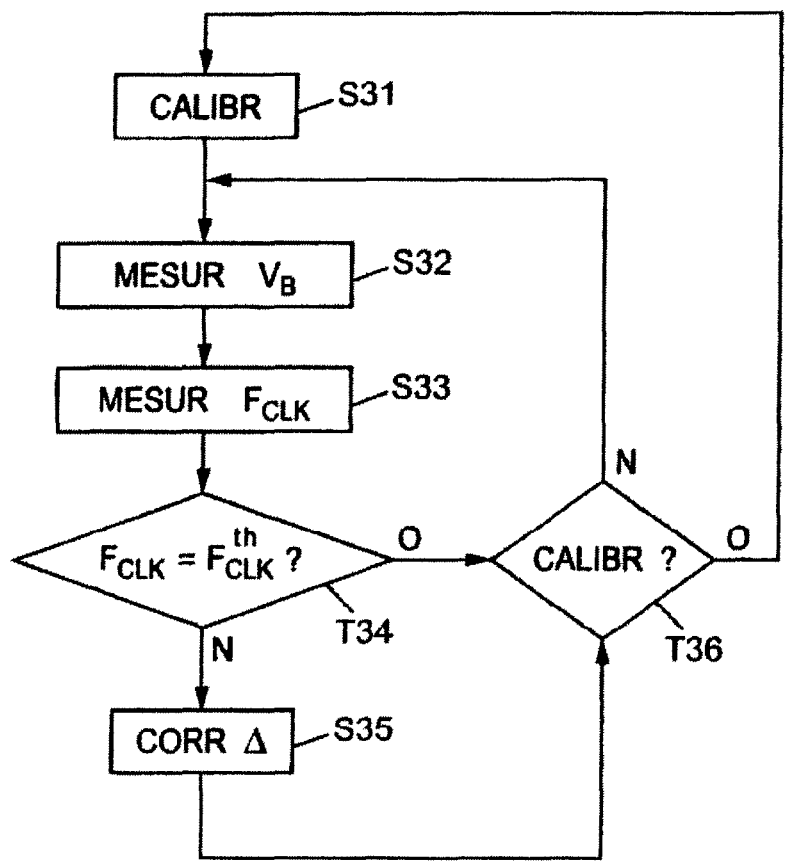
FIG. 3 illustrates the steps of a method according to some embodiments of the invention.

The steps of a method for estimating and correcting frequency offset according to some embodiments are now presented with reference to FIG. 3.

In a first step S31, the characteristic curve which will be used in determining the value of the signal frequency at the comparator input A is established. This characteristic is stored in the table TAB. One can refer to the explanations given above concerning the establishing of such a characteristic curve.

Then, during the step S32, the value of the signal at the filter output is measured. This measurement is done by the measurement module MESUR. This measured value then allows calculating the current value of the signal frequency at the comparator input A during the step S33. This current value of the frequency is then compared to a theoretical value of the frequency during the step T34.

If the current value is considered to be fairly close to the theoretical value, for example if the current value only differs from the theoretical value by a predictable amount due to inaccuracies in measurement, the method returns to the step S32 for measuring the signal value at the filter output. This return to step S32 occurs via a step T36 which allows returning to the first step in establishing the characteristic curve.

In fact, as mentioned above, it can be useful to establish this curve several times during the life of the circuit. Thus, the step T36 can consist of verifying whether a set of conditions for establishing a new curve have been met, for example verifying whether a certain interval of time has passed since the last time the characteristic curve was established.

If, on the other hand, the difference between the current value of the signal frequency at the clock output and the theoretical value is considered to be too large, the method advances to the frequency correction step S35, implemented by the correction module CORR as mentioned above.

Once the correction is done, the method returns to the measurement step S32. Again, this return can occur via the step T36 already mentioned.

A computer program for implementing the method can be realized according to an algorithm deduced from the general flow chart in FIG. 3 and from the above description. This computer program is intended to be implemented by a terminal comprising a circuit as described above.

Figure 4:
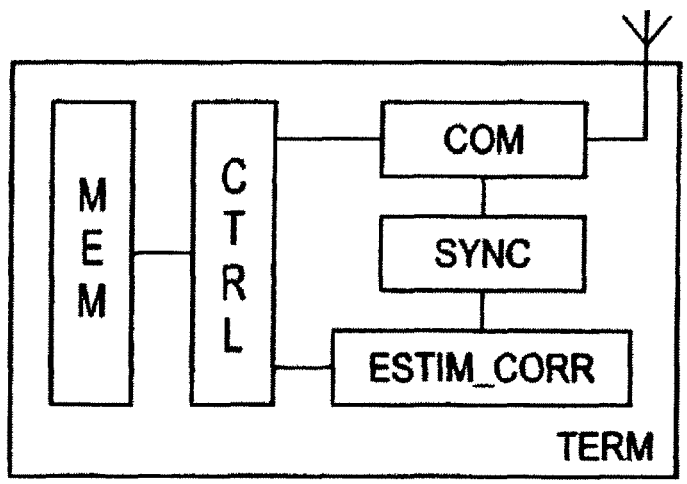
FIG. 4 illustrates a terminal according to some embodiments of the invention.

A terminal TERM according to one embodiment of the invention is represented schematically in FIG. 4. This terminal comprises a frequency offset estimation and correction module ESTIM_CORR including a circuit as shown in FIG. 1. The terminal additionally comprises a synchronization module SYNC for synchronizing the terminal on a radio communications network by demodulating signals carried by a carrier frequency, and a communication module COM for sending and receiving data via this network. The modules are arranged so as to allow the terminal to correct a frequency offset as described above in order to come as close as possible to the carrier frequency and synchronize with the carrier frequency of the network. These various elements are controlled by a control unit CTRL, notably controlling the correction module comprising the circuit shown in FIG. 1, and comprising a processor, which executes a computer program for implementing the method of the invention, stored in a memory MEM of the terminal.

Of course, the invention is not limited to the embodiments described here. It extends to other variations.

The invention claimed is:

1. A radio-frequency circuit comprising:
   an output operative to deliver a radio-frequency output signal;
   a control unit;
   a memory;
   an input operative to receive an input signal at a given reference frequency; and
   a phase-locked loop comprising
      a comparator having an output and a first input coupled to the radio-frequency circuit input;
      a filter having an output and an input coupled to the output of the comparator;
      a controlled frequency generator having an output coupled to the radio-frequency circuit output and an input coupled to the output of the filter; and
      wherein the comparator has a second input coupled to the output of the controlled frequency generator;
   wherein the memory stores a characteristic curve indicative of correlations between signal values measured at the filter output and reference frequency values at the comparator input, and wherein the control unit is arranged to determine an offset between an actual value of the reference frequency obtained on the basis of a measurement of the signal output from the filter and a theoretical value of said frequency known to the control unit, via the characteristic curve stored in the memory, and to control a correction of said offset.

2. The circuit of claim 1, wherein the memory stores a mathematical model of the relation between signal values at the filter output and reference frequency values.

3. The circuit of claim 1, further comprising a measurement module operative to measure the signal values at the filter output, and wherein the control unit is configured to calibrate the circuit in order to obtain the relation between signal values at the filter output and reference frequency values.

4. The circuit of claim 3 wherein the calibration occurs prior to use of a device including the radio-frequency circuit.

5. The circuit of claim 3 wherein the calibration occurs periodically.

6. A mobile telecommunications terminal comprising:
a radio-frequency circuit comprising
an output operative to deliver a radio-frequency output signal;
a control unit;
a memory;
an input operative to receive an input signal at a given reference frequency; and
a phase-locked loop comprising
a comparator having an output and a first input coupled to the radio-frequency circuit input;
a filter having an output and an input coupled to the output of the comparator;
a controlled frequency generator having an output coupled to the radio-frequency circuit output and an input coupled to the output of the filter; and
wherein the comparator has a second input coupled to the output of the controlled frequency generator;
wherein the memory stores a characteristic curve indicative of correlations between signal values measured at the filter output and reference frequency values at the comparator input, and wherein the control unit is arranged to determine an offset between an actual value of the reference frequency obtained on the basis of a measurement of the signal output from the filter and a theoretical value of said frequency known to the control unit, via the characteristic curve stored in the memory, and to control a correction of said offset.

7. A method of controlling a radio-frequency circuit comprising an output operative to deliver a radio-frequency output signal, a control unit, a memory, an input operative to receive an input signal at a given reference frequency, and a phase-locked loop comprising a comparator having an output and a first input coupled to the radio-frequency circuit input, a filter having an output and an input coupled to the output of the comparator, a controlled frequency generator having an output coupled to the radio-frequency circuit output and an input coupled to the output of the filter, and wherein the comparator has a second input coupled to the output of the controlled frequency generator the method comprising steps performed by the control unit, the method steps comprising:
measuring a signal value at the filter output;
calculating an actual value for the reference frequency;
obtaining a theoretical value for the frequency based on a characteristic curve indicative of correlations between signal values measured at the filter output and reference frequency values at the comparator input, wherein the characteristic curve is stored in the memory;
comparing the calculated actual value to the theoretical value for the frequency;
estimating an offset between the actual value of the reference frequency and the theoretical value for said frequency; and
correcting the offset.

8. The method of claim 7, wherein estimating an offset comprises establishing a relation between different signal values output from the filter and different reference frequency values, and estimating the offset by means of this relation.

9. The method of claim 7, wherein the radio-frequency circuit resides in a mobile communication terminal operative in a telecommunications network, further comprising the step of synchronizing the terminal with the network.

10. A non-transitory computer-readable medium including program instruction operative to cause a control unit in a radio-frequency circuit comprising an output operative to deliver a radio-frequency output signal, the control unit, a memory, an input operative to receive an input signal at a given reference frequency, and a phase-locked loop comprising a comparator having an output and a first input coupled to the radio-frequency circuit input, a filter having an output and an input coupled to the output of the comparator, a controlled frequency generator having an output coupled to the radio-frequency circuit output and an input coupled to the output of the filter, and wherein the comparator has a second input coupled to the output of the controlled frequency generator, to perform the steps of:
measuring a signal value at the filter output;
calculating an actual value for the reference frequency;
obtaining a theoretical value for the frequency based on a characteristic curve indicative of correlations between signal values measured at the filter output and reference frequency values at the comparator input, wherein the characteristic curve is stored in the memory;
comparing the calculated actual value to the theoretical value for the frequency;
estimating an offset between the actual value of the reference frequency and the theoretical value for said frequency; and
correcting the offset.

* * * * *